(12) United States Patent
van den Ende

(10) Patent No.: US 10,309,377 B2
(45) Date of Patent: Jun. 4, 2019

(54) BI-DIRECTIONAL ACTUATOR

(71) Applicant: KONINKLIJKE PHILIPS N.V., Eindhoven (NL)

(72) Inventor: Daan Anton van den Ende, Breda (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 0 days.

(21) Appl. No.: 15/548,248

(22) PCT Filed: Jan. 21, 2016

(86) PCT No.: PCT/EP2016/051173
§ 371 (c)(1),
(2) Date: Aug. 2, 2017

(87) PCT Pub. No.: WO2016/124405
PCT Pub. Date: Aug. 11, 2016

(65) Prior Publication Data
US 2018/0266401 A1    Sep. 20, 2018

(30) Foreign Application Priority Data

Feb. 6, 2015    (EP) .................................... 15154054

(51) Int. Cl.
*F03G 7/00*    (2006.01)
*F03G 7/06*    (2006.01)
(Continued)

(52) U.S. Cl.
CPC .............. *F03G 7/065* (2013.01); *B26B 19/28* (2013.01); *B32B 15/08* (2013.01); *F03G 7/005* (2013.01);
(Continued)

(58) Field of Classification Search
CPC .......... F03G 7/065; F21V 5/008; F21V 14/06; H01L 41/042; H01L 41/0933;
(Continued)

(56) References Cited

U.S. PATENT DOCUMENTS 7,575,807 B1    8/2009    Barvosa-Carter et al.
8,188,844 B2    5/2012    Lenneman et al.
(Continued)

FOREIGN PATENT DOCUMENTS

DE         10142998         3/2003
WO         2004033164 A1    4/2004

*Primary Examiner* — Thomas M Sember

(57) ABSTRACT

A thermally and electrically controllable miniaturised actuator comprises a bi-layer structure formed of a shape-memory alloy layer coupled with an electro-active polymer layer. A heating means is provided for thermal stimulation of the shape-memory alloy layer, this layer transitioning from an initial shape at a first temperature to a second, pre-determined, shape at a second temperature. Application of an electric field to the electro-active polymer layer stimulates this layer to deform in response, with a stress which may exceed that of the alloy layer, when the latter layer is in a low-temperature phase. Actuation methods are further provided, which include stimulating the polymer layer to deform in an opposite 'direction' to the deformation of the alloy layer, thus allowing the actuator to be 'reset' in between strokes. Methods of producing an actuator are also provided.

15 Claims, 5 Drawing Sheets

(51) Int. Cl.
  *H05B 3/00* (2006.01)
  *B26B 19/28* (2006.01)
  *B32B 15/08* (2006.01)
  *F21V 14/06* (2006.01)
  *H01L 41/04* (2006.01)
  *H01L 41/09* (2006.01)
  *F21V 5/00* (2018.01)
  *H01L 41/193* (2006.01)
  *F21Y 101/00* (2016.01)
  *F21Y 115/10* (2016.01)

(52) U.S. Cl.
  CPC ............ *F21V 5/008* (2013.01); *F21V 14/06* (2013.01); *H01L 41/042* (2013.01); *H01L 41/0926* (2013.01); *H01L 41/0933* (2013.01); *H01L 41/193* (2013.01); *H05B 3/0004* (2013.01); *B32B 2307/738* (2013.01); *F05C 2251/08* (2013.01); *F21Y 2101/00* (2013.01); *F21Y 2115/10* (2016.08); *H01L 41/0946* (2013.01)

(58) Field of Classification Search
  CPC ..... H01L 41/193; H05B 3/0004; B26B 19/28; B32B 15/08
  See application file for complete search history.

(56) References Cited

U.S. PATENT DOCUMENTS

| | | |
|---|---|---|
| 8,237,324 B2 | 8/2012 | Pei et al. |
| 8,810,113 B2 | 8/2014 | Han et al. |
| 2005/0117342 A1 | 6/2005 | Perlo |
| 2006/0145544 A1 | 7/2006 | Browne et al. |
| 2008/0217927 A1 | 9/2008 | Browne et al. |
| 2012/0137672 A1 | 6/2012 | Pinto, IV et al. |
| 2012/0161579 A1 | 6/2012 | Browne et al. |
| 2012/0239183 A1 | 9/2012 | Mankame et al. |
| 2014/0026554 A1 | 1/2014 | Browne et al. |

BI-DIRECTIONAL ACTUATOR

CROSS-REFERENCE TO PRIOR APPLICATIONS

This application is the U.S. National Phase application under 35 U.S.C. § 371 of International Application No. PCT/EP2016/051173, filed on Jan. 21, 2016, which claims the benefit of European Application No. 15154054.9, filed Feb 6, 2015. These applications are hereby incorporated by reference herein, for all puposes.

FIELD OF THE INVENTION

This invention relates to a bi-directional miniaturised actuator.

BACKGROUND OF THE INVENTION

There are many applications which could benefit from a reduced size actuator, but which can induce a significant stroke and apply a significant force.

Motors are most commonly used as actuators for generating large strokes and forces. For many miniaturized applications, even small motors are too large, heavy, noisy and expensive. Moreover, miniature motors suffer from lower efficiency.

Shaped memory materials (SMMs), especially shape memory alloys (SMAs), are able to provide significant force and stroke when heated beyond their specific phase change temperature. Even if the dimensions of the material are small, the force and stroke delivered are, relative to these dimensions, very high and accurate, over a very long period of time and after many switching operations.

The use of shape memory materials to provide an actuation signal, dependent on temperature, has thus been investigated. For example, US2014/0007572 discloses the use of a shape memory alloy wire which contracts upon an increase in temperature above the phase-change temperature of the material, thereby engaging the actuator. Upon temperature decrease and transition of the wire back to the low temperature phase, restoration of the original length of the wire, and hence resetting of the actuator, is achieved through the use of additional bias springs which stretch the wire back to its low temperature length.

The requirement for external mechanical biasing to reset the shape of the actuator is a disadvantage which follows from the fact that when there is a temperature decrease, the phase changes back to the original phase, but the shape does not. Thus, before the actuator can be used again, after a temperature decrease, an external actuation must be initiated to reverse the shape change of the SMM.

External mechanical biasing introduces significant bulk, cost and manufacturing complexity to an actuator device, often undermining many of the key advantages which an application of SMAs can deliver. Moreover, the use of permanent mechanical bias springs reduces the effective stroke of the actuator.

Desired therefore is a miniaturized actuator device utilizing SMA materials in order to provide significant actuation force, having bi-directional capability, but without the requirement for bulky or complex reverse biasing mechanisms in order to reset the actuator in between strokes.

SUMMARY OF THE INVENTION

The invention is defined by the claims.

According to an aspect of the invention, there is provided a bi-directional actuator, comprising:

a heat-sensitive shape-memory layer, the shape-memory layer comprising a shape memory alloy, the alloy existing in a first phase below a first temperature, and a second phase above a second temperature, and wherein a transition from the first to the second phase stimulates the layer to move from any first shape into a second, predetermined shape;

an electro-active polymer layer, coupled with the shape memory alloy layer such that both follow the same shape, the electro-active polymer layer being deformable, in response to an applied voltage; and a heating means for controlling the temperature of the heat-sensitive shape-memory layer.

Electro-active polymers (EAPs) comprise a group of materials which undergo controlled deformation in response to an applied electric field. The stress generated by an EAP whilst undergoing deformation is significantly less than that generated by a shape memory alloy (SMA) undergoing deformation, and hence has limited utility within actuation applications on its own. However, the stress generated by an EAP is sufficient to overcome the resistive forces of an SMA when said SMA is in its low temperature phase, and hence sufficient to deform the shape of such a layer during such a phase.

Embodiments of the invention thus utilise the shape-deforming properties of EAPs in order to provide a 'reverse actuation' function within the context of an SMA-based actuator. The SMA layer may be heated by use of the heating means, and thus induced to transition from an initial shape into its high-temperature shape-memory shape, delivering an actuating force as it does so. Once cooled to below its phase-transition temperature, the SMA becomes super-elastic, and can be manipulated with less applied force than during its high-temperature phase. An electric field may then be established across the coupled EAP layer, inducing said layer to deform in response, this deformation pulling the SMA layer with it, and hence 'resetting' the actuator back to its original, initial shape.

The EAP layer hence facilitates bi-directionality of the actuator without incurring any significantly increased bulk—since just a very thin foil of EAP, in the context of a miniaturised actuator, is sufficient to deform the SMA layer when in the low-temperature phase.

Although the force generated by an EAP during deformation is less than that of an SMA, any excess force which is generated over and above that required to displace the SMA, during the 'reverse journey', might nonetheless be utilised to perform some (less intensive) reverse actuation function. Moreover, electro-active polymers possess the property that the extent of their deformation can be controllably varied by varying the magnitude of electric field applied to them. A greater field will incur a greater strain, a lesser a field, a lesser strain. This is in contrast to SMAs which generally switch from one end state to another, with no means of controlling the extent of deformation. Hence, the EAP layer might in some embodiments be utilised to provide an additional functionality: low intensity, but carefully controllable actuation in the opposite direction to the deformation of the SMA.

In one group of embodiments, the heating means comprises at least two contact terminals in electrical communication with the shape memory alloy, for the delivery of an electrical current through the alloy.

By applying a potential difference across the two terminals, the alloy layer is stimulated to undergo Joule heating. The terminals might, for example, be provided at two opposite ends of the alloy component, thereby facilitating heating across the entire extent of the material.

While Joule heating represents a direct and efficient means of increasing the alloy temperature, in certain embodiments, it might be disadvantageous or problematic to induce a current across the alloy itself—for example where such a current might interfere with neighbouring components in a particular application. Hence, according to a different group of embodiments, the heating means comprises a heating element in thermal communication with the shape-memory layer. The heating element might, in some cases, comprise an element being physically attached to the alloy, or alternatively, might comprise an element arranged and adapted to heat the environment surrounding the alloy, or surrounding bi-layer structure as a whole.

The heat-sensitive shape-memory layer may in some embodiments comprise a layer of polymer material having an embedded shape memory alloy wire. In this case, the polymer layer may act as electrical and thermal insulation between the SMA wire and the EAP material. In alternative embodiments, the shape-memory layer might simply comprise a thin sheet or foil of shape memory alloy, having no surrounding polymer component.

There is further provided, according to an aspect of the invention, a beam-shaping element, comprising:

a channel having one or more boundary walls, at least one boundary wall comprising one or more of the actuators as claimed in any preceding claim.

By controllably stimulating the actuators comprising the boundary walls, the shape and/or relative directional orientation of the channel can be dynamically adjusted. For example, the beam-shaping element might facilitate a dynamic beam-steering within a lighting application, wherein the oppositely positioned actuators are stimulated to bend in parallel in the same given direction, thereby 'sweeping' an open end of the channel from one directional orientation to another. Alternatively, oppositely positioned actuators might be stimulated to deform 'inwards', towards one another, thereby 'squeezing' the channel and changing the diameter of at least one open end of the channel.

In addition, the beam shaping element might further comprise one or more optical elements arranged at one end of the channel. These may be singular elements or arrays of elements. At least a sub-set of the elements might be mounted to an end of the channel, such that the elements move with the channel as it is stimulated to 'sweep' in the manner described above.

There is further provided, according to an aspect of the invention, an adaptive lighting device comprising:

one or more of the beam-shaping elements described above; and one or more solid-state lighting elements disposed within the boundary walls of the channel.

Solid state lighting elements might be positioned on a substrate layer or PCB at the base of a beam shaping element, such that light generated from the elements can be adapted to provide a desired output distribution or beam shape/direction.

According to further aspect of the invention, there is also provided a skin-contacting structure for a skin-hair shaving device, the skin contacting structure for contacting a skin contact portion during shaving of said skin by the shaving device, the structure comprising an actuator as claimed in any of claims 1-4 for altering a relative position or orientation between at least a part of the skin contacting structure and the skin portion.

The controllable deformation of the EAP layer might for example be employed in such an embodiment in order to provide precise skin-shaver position adjustments, in real time according to the movement of the shaver across the skin by a user. The relative position of the skin contacting structure and the skin may be adjusted in order to maintain continuous skin contact for maximised cutting efficiency across a given skin area.

According to another aspect of the invention, there is provided a bi-directional actuation method, comprising:

using a heating means to increase the temperature of a first layer element, the element comprising a shape-memory alloy, and the increase in temperature stimulating the alloy to transition from a first shape at a first temperature into a second, predetermined shape at a second temperature;

decreasing the temperature of the first layer element to a third temperature; and applying a voltage to a second layer element, the second layer element being coupled with the first layer element such that the two follow the same shape, and comprising an electro-active polymer, the voltage stimulating the polymer to deform from the second, pre-determined shape, into a third shape, the third shape dependent upon the magnitude of the voltage.

The first shape may in general comprise any arbitrary shape into which the SMA layer has been externally deformed whilst in its low temperature (low stress) phase. The first temperature may in general be any temperature below the particular 'low-phase to high-phase' transition temperature—the particular value of which depends upon the particular alloy material. The alloy is heated using the heating means to bring it above this transition temperature, at which point it is stimulated to change from its initial shape into a second, pre-determined, shape-memory shape. The second temperature is, in general, any temperature above the low-high transition temperature.

Upon deformation to its shape-memory shape, the temperature of the layer is then decreased to a third temperature, this third temperature being any which is below the particular 'high-phase to low-phase' transition temperature belonging to the material. At this third temperature, the layer is once again in its low-temperature (malleable) phase. Decreasing of the temperature might in some embodiments comprise 'passively' decreasing the temperature; the heating means is switched off, and the layer allowed to cool by transfer of heat to the surrounding environment. Alternatively, the temperature of the layer might be decreased actively, by application of some external cooling element or device.

Once the SMA layer is cooled to its low-temperature phase, the EAP layer may be electrically stimulated to deform in the opposite 'direction' to the deformation of the SMA layer, thereby bringing the actuator to a third shape. In certain embodiments, the voltage is applied to the second layer element having a magnitude such that the third shape is identical to the first shape. In this way, the deformation of the EAP layer returns or 'resets' the actuator to the initial, starting, first shape.

On deactivating the applied current, the internal resistive force of the SMA layer—still in its low-temperature phase—is sufficient to keep the actuator from returning to the natural low-voltage shape of the EAP, and hence the actuator retains its shape and does not deform. Although the EAP generates sufficient stress when electrically activated to overcome the resistive forces of the SMA layer when in low-temperature phase, when non-active, the internal stress of the SMA exceeds that of the EAP, allowing the SMA to hold the shape of the actuator.

In some embodiments of the above method, the shape transition of the first layer element is used to deliver an actuation force, while in others, the shape transition of the second layer element may be used to deliver an actuation force. In still others, both shape transitions may be used to deliver actuation force.

As described above, the shape transition of the first layer element is capable of performing greater work during its deformation that that of the second, but the transition of the second layer is controllable in terms of its extent and its rate of change. Within different applications, different of these embodiments may be the most useful.

The heating means within the above described actuation method may comprise a Joule heating process, wherein a current is passed through at least a portion of the first layer element.

In some embodiments, the voltage may be applied to the second layer element via the first layer element, the first layer element being in electrical communication with the second. The first layer element acts in this case as anode and/or cathode to the second layer element. This avoids the need to provide dedicated terminals to the EAP layer for the delivery of the voltage. Since in performing the actuation method, it is never the case that the first layer need be heated at the same time as the second layer need be electrically stimulated, use of the first layer as anode/cathode to the second layer need not interfere with any Joule heating process of said first layer.

According to another aspect of the invention, there is provided a method of producing a bi-directional actuator, comprising:

coupling a first layer element, comprising a shape-memory alloy, to a second layer element, comprising an electro-active polymer, such that the two elements follow the same shape; and providing a heating means such that the heating means is in thermal communication with the first layer element.

The coupling might comprise, in certain embodiments a lamination process, for example. In other embodiments, the coupling might be achieved through a 'coating' of the polymer layer onto the alloy layer, for example.

BRIEF DESCRIPTION OF THE DRAWINGS

Examples of the invention will now be described in detail with reference to the accompanying drawings, in which.

DETAILED DESCRIPTION OF THE EMBODIMENTS

The invention provides a thermally and electrically controllable miniaturised actuator comprising a bi-layer structure formed of a shape-memory alloy layer coupled with an electro-active polymer layer. A heating means is provided for thermal stimulation of the shape-memory alloy layer, this layer transitioning from an initial shape at a first temperature to a second, pre-determined, shape at a second temperature. Application of an electric field to the electro-active polymer layer stimulates this layer to deform in response, with a stress which may exceed that of the alloy layer, when the latter layer is in a low-temperature phase. Actuation methods are further provided, which include stimulating the polymer layer to deform in an opposite 'direction' to the deformation of the alloy layer, thus allowing the actuator to be 'reset' in between strokes. Methods of producing an actuator are also provided.

Shape memory materials (SMMs) are well known, in particular shape memory alloys (SMAs). The two main types of shape memory alloys are copper-aluminium-nickel, and nickel-titanium (NiTi), which is known as Nitinol. Nitinol is for example available in the form of a wire, rod and bar, or as a thin film. SMAs can however also be created by alloying zinc, copper, gold and iron.

SMAs can exist in two different phases, with three different crystal structures (i.e. twinned martensite, detwinned martensite and austenite). Nitinol alloys change from the martensite state to the austenite state when heated, and returns when cooled.

Figure 1:
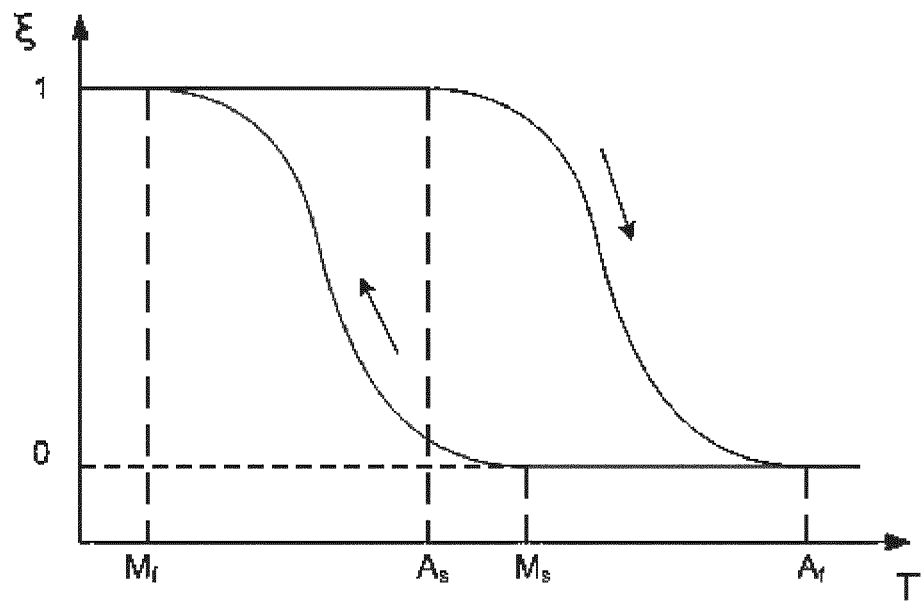
FIG. 1 shows the temperature-phase relationship for a shape memory alloy.

FIG. 1 shows the martensite fraction as a function of heating, during heating and cooling. During heating As and Af are the temperatures at which the transformation from martensite to austenite starts and finishes. The temperature As is the transition temperature. During cooling, Ms and Mf are the temperature at which the transition to martensite starts and completes.

The difference between the heating transition and the cooling transition gives rise to hysteresis where some of the mechanical energy is lost in the process. The shape of the curve depends on the material properties of the shape memory alloy, such as the alloying and work hardening.

The transition from the martensite phase to the austenite phase is only dependent on temperature and stress, not time. When a shape memory alloy is in its cold state (below As), the metal can be bent or stretched and will hold those shapes until heated above the transition temperature. Upon heating, the shape changes to its original shape. When the metal cools again it will change phase but not shape, and thus remain in the hot shape, until deformed again.

With this one-way effect, cooling from the high temperatures does not cause a macroscopic shape change. A deformation is necessary to recreate the low temperature shape. The transition temperature As for Nitinol is determined by the alloy type and composition and can vary between −150° C. and 200° C. Generally, a transition temperature in the range −20° C. to 120° C. is used. Thus, the transition temperature can be tuned to a particular application.

There are also materials with a two way shape memory effect, based on cold work or hardening, with high stresses in the martensitic phase. However, the effect does not allow repeated temperature cycles, because stresses are released over time. This invention relates in particular to one way shape memory materials.

Figure 2:
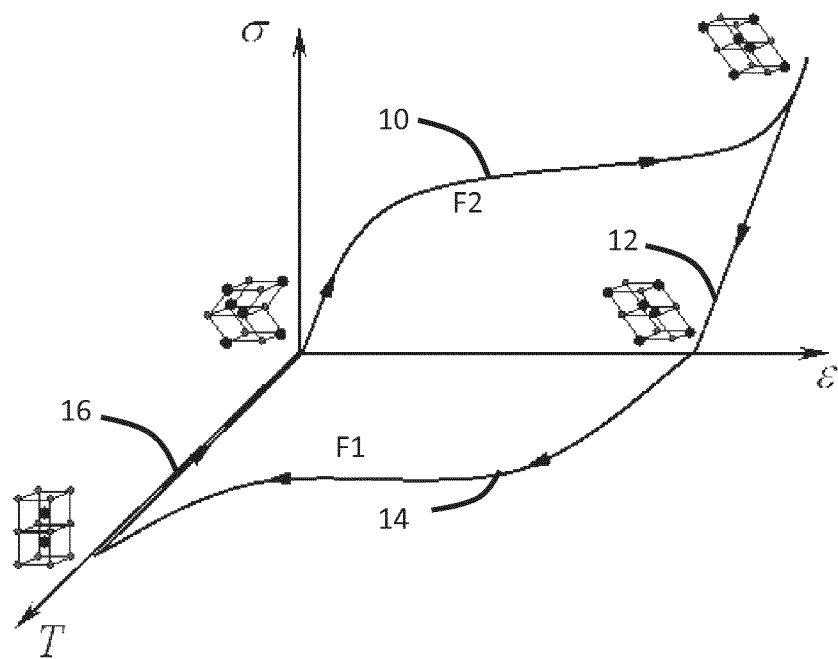
FIG. 2 shows the temperature—stress—strain relationship for a shape memory material.

As mentioned above, the phase transitions depend on stress as well as temperature. FIG. 2 is a schematic diagram showing a stress-strain-temperature function for the shape memory effect. The stress is shown as σ and the strain is shown as ε.

The material is annealed to remember a specific shape. The material is deformed into its low temperature shape along path 10 by applying a stress to the material. This is a detwinning region. There is a sharp increase in slope in the stress-strain curve after which the material becomes much more difficult to deform further. Once the stress is relieved shown as path 12, the large strain still stays in the material until heating above the transition temperature. This is the heating path 14 to bring the material to the austenite phase. It can then cool back into the twinned martensite phase along path 16 at which point the strain in the material has been relaxed (but the shape has not changed back).

The Modulus of Elasticity (E-modulus) of the high temperature phase of the SMA is significantly higher than the E-modulus of the low temperature phase.

The shape change that accompanies this phase change during heating is able to deliver a first force F1. After the temperature decrease below the phase change temperature, and thus after phase change to the low temperature phase, a lower force F2 is necessary to reshape the SMA into its original form (path 10 in FIG. 2).

Electro-active polymers are a group of polymers which exhibit a change in size or shape when stimulated by an electric field. In particular, electro-active polymers include electrostrictive polymers and ionic polymers, which are capable of generating a controlled deformation when a voltage is applied to them. The extent of deformation can be controlled by varying the applied voltage, which allows for a digital control over the displacement. In contrast to shape-memory alloys, wherein the high-temperature shape persists even after the material has re-entered the low temperature phase, an electro-active polymer reverts to back to its original shape, as soon as the electrical stimulus is removed.

Figure 3:
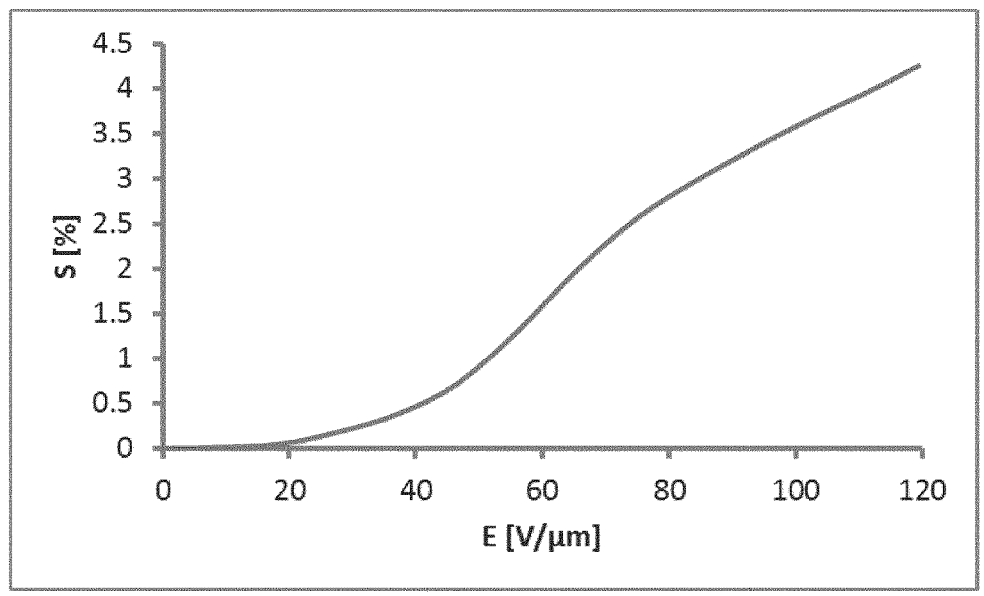
FIG. 3 shows a strain-voltage curve for a typical EAP suitable for use within the invention.

FIG. 3 shows an exemplar strain-voltage curve for a typical electro-active polymer, with the strain corresponding to total incurred deformation as a proportion of the total length of the material, and E corresponding to the electric field applied across the material. Unlike the strain-temperature relationship for SMAs (illustrated in FIG. 2), there is, for electro-active polymers, a one-to-one relation between the two, such that a zero voltage always returns the material to a single particular zero-strain (undeformed) shape.

The particular EAP to which the curve of FIG. 3 corresponds is a field driven relaxor ferroelectric EAP. The strain versus applied electric field relation shown is typical for PVDF based terpolymer systems, such as PVDF-TrFE-CFE. The PVDF-TrFE-CFE material typically has a relatively high elastic modulus compared to other EAPs such as ionic polymers and dielectric elastomers and therefore is typically suited to deform the SMA.

The invention is based on combining the shape-change properties of shape-memory alloys with those of electro-active polymers in order to provide an actuator device capable of delivering high actuating force in at least one direction, but which also exhibits bi-directional functionality, such that the actuator can be reverse-deformed without the need for bulky external mechanical biases. A layer of shape-memory alloy is coupled with a layer of electroactive polymer to form the actuator device. The shape-memory alloy deforms with significant excess force on transition between low-temperature and high temperature phases, an excess force which may be readily utilised within an actuation event. The electro-active polymer allows for 'manual' deformation of the SMA back away from its high-temperature shape, through application of an electric field, and, moreover, allows for the speed and extent of this deformation to be controlled.

Figure 4:
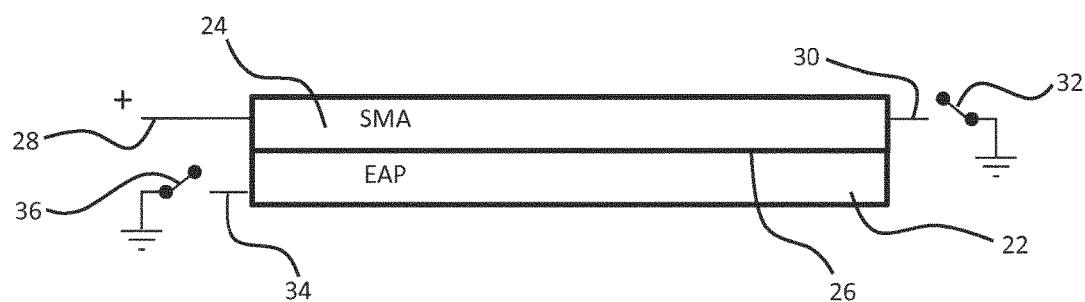
FIG. 4 shows a first example actuator embodiment.

In FIG. 4 is shown a simple first example of an actuator in accordance with the invention. A layer of electro-active polymer (EAP) 22 and a layer of shape-memory alloy (SMA) 24 are coupled at a planar interface 26, such that the two follow the same shape. The SMA layer is provided with a heating means, comprising anode 28 and cathode 30, facilitating the application of a current across the layer, for inducing Joule heating of the material. The heating means thus includes electrodes for application of current for Joule heating. The heating means might further comprise a switch component 32 for controlling the heating of the layer on application of a positive voltage to anode 28. However, in alternative embodiments, an external control module might instead be utilised for controllably applying voltages at the various anodes and cathodes, and hence switch elements not required.

Note further, that although in the particular example of FIG. 4, the actuator incorporates a shape-memory layer 24 composed entirely of shape-memory alloy material, in alternate examples, the shape-memory layer might comprise a layer composed partly or mostly of a polymer (or some other non-conductive) material, but having an embedded shape-memory element, such as a shape-memory wire. In this case anode 28 and cathode 30 are provided directly to said element, or wire, rather than to the surrounding layer structure. In this case, the polymer material may act to provide an electrical and thermal insulation between the SMA element and the EAP material. This may be useful, for example, where it is desirable that the temperature of the EAP layer remain substantially constant or stable during both the high and low temperature phases of the SMA material.

To the EAP layer 26 is provided a second cathode 34, connected via a second switch element 36 to a ground potential. On application of a non-zero voltage at anode 28, and with first cathode switch element 32 open, the alloy material across the SMA layer acquires the electric potential applied at the anode, and hence effectively extends the surface area of the anode to cover the entire top surface of the EAP layer. In combination with second cathode 34, the SMA layer thus stimulates an electric field across the EAP layer. Since the EAP material itself is non-metallic, no current is generated by this process through either of the layers—and unintended joule heating of the SMA is therefore avoided.

While in the example of FIG. 4, the SMA layer itself is utilised as an electrode for the EAP layer, in other embodiments, the EAP layer might instead be provided a dedicated anode-cathode pair, such that electrical stimulation may be induced across the material independently of the SMA layer above. Such an embodiment might be preferred, for example, where electrical and/or thermal communication between the two layers is undesirable or disadvantageous. In these cases, insulation between the two layers might be additionally provided—for example in the form of an additional intermediate layer in which case independent electrical stimulation of the EAP layer would be preferred.

Thus, in all cases, there is an electrode arrangement associated with the EAP layer, which may comprises a dedicated electrode pair or else may share an electrode with the heating electrode arrangement when this is implemented as a Joule heating arrangement.

Furthermore, although the example of FIG. 4 includes a heating means comprising anode 28 and cathode 30 (for facilitation of Joule heating), in other embodiments, the heating means might instead comprise an external heating component, either physically attached to the SMA layer, or otherwise arranged so as to heat an environment surrounding the SMA layer. While Joule heating represents a direct and efficient means of increasing the alloy temperature, in certain embodiments, it might be disadvantageous or problematic to induce a current across the alloy itself—for example where such a current might interfere with neighbouring components in a particular application. In these cases, a dedicated heating element in thermal communication with (at least) the SMA layer may be preferable to anode and cathode for directing current across the layer.

Figure 5:
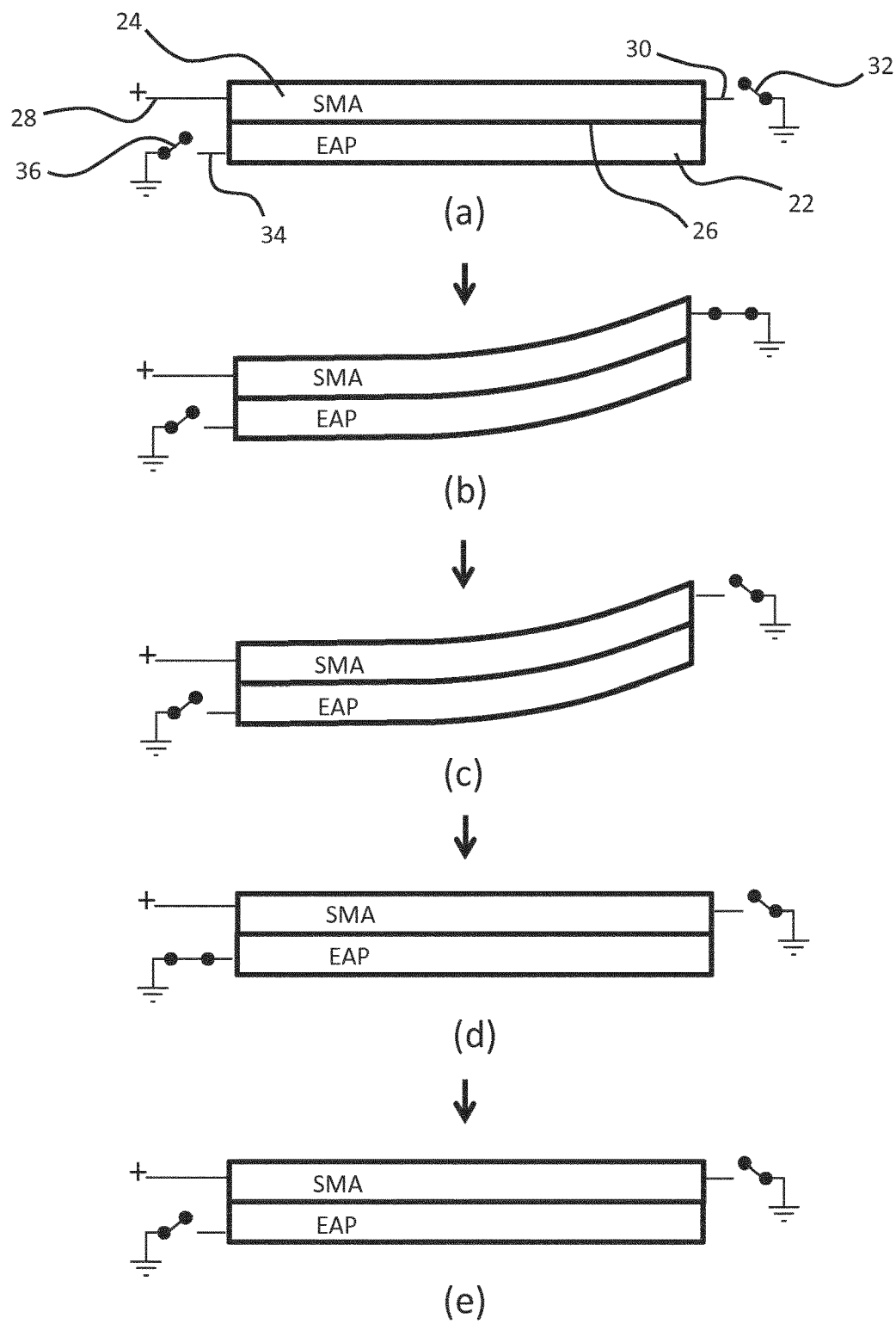
FIG. 5 shows a first example actuation method, in accordance with the first actuator embodiment.

Through control of applied voltages at the three contact terminals 28, 30, 34, the bi-layer structure of FIG. 4 may be stimulated to provide actuation in both a forward and reverse direction. In FIG. 5 are shown stages (a)-(e) in a first example actuation cycle in accordance with embodiments of the invention. At (starting) stage (a), the actuator is in a 'flat' or 'unactuated' shape. Both first 30 and second 34 cathodes are disengaged and no electric fields or currents are acting. The SMA layer at this stage in the cycle is in its low-temperature, martensite, phase—i.e. at a temperature at least below As (cf. FIG. 1).

First activation of the actuator is stimulated at stage (b), through engagement of the first cathode 28, thereby inducing Joule heating across the SMA layer. In response, the SMA layer increases in temperature, from a first temperature, below As, to a second temperature, above Af. As the temperature increases from As to Af, the phase of the SMA material transitions from martensite to austenite, consequently stimulating the material to transition into its high-temperature memory-shape. As described above, this shape change represents the relieving of stress built up in the material through the process of deforming it away from its memory shape, and this excess stress may be utilised in order to deliver an actuation force 1l.

FIG. 5(b) shows the actuator once the SMA has acquired a temperature T>Af, and once the accompanying shape-transition has occurred. At this point, the current across the layer is disengaged, and the SMA layer is allowed to cool again, to a temperature below Mf. As the temperature decreases from Ms to Mf, the layer once again transitions back to its martensite phase. FIG. 5(c) shows the actuator once this cooling has occurred. On transition from austenite to martensite, the layer retains its shape, but its modulus of elasticity significantly decreases. In simulations, an SMA layer was used exhibiting modulus of elasticity of 75 GPa during austenite phase, this dropping to 25 GPa during martensite phase. This reduction in stiffness means that the SMA layer can be manually deformed with a force F2 much less than the force F1 exerted by the layer itself during its transition from stage (a) to stage (b).

Accordingly, in stage (d), second cathode 34 is engaged, thereby inducing an electric field across the EAP layer. The EAP deforms in response to an applied field, with the degree of deformation dependent upon the magnitude of the applied voltage (cf. FIG. 3). Voltage is applied at anode 28 having sufficient magnitude that the EAP layer deforms from shape (c) (the memory-shape of SMA layer) into the same flat shape with which the actuator began in stage (a). The modulus of elasticity of the SMA layer is sufficiently low, once cool, that the force generated by the EAP during its deformation is enough to bend both layers in concert, and thereby re-shape the whole actuator structure. Hence the electrically stimulated deformation of the EAP layer is utilised in (d) to 'reset' the actuator back to initial 'unactuated' configuration.

On disengaging the cathode 34, and thereby terminating the electric field, the stress generated internally by the EAP drops to zero (cf. FIG. 3). However, the modulus of elasticity of the cool SMA exceeds that of the non-stimulated EAP, and hence the actuator retains its flat shape even once the field has been switched off. FIG. 5(e) depicts this final stage of the actuation cycle, which returns the actuator to an identical state as in stage (a).

Figure 6:
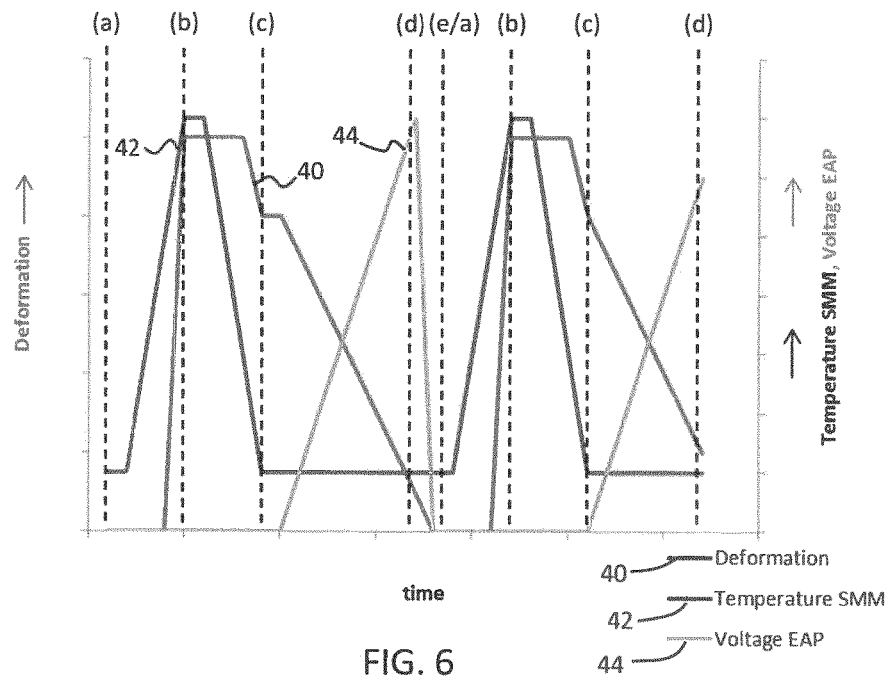
FIG. 6 presents a graphical representation of the first actuation method, in terms of changes in actuator deformation, SMA temperature and EAP voltage over time.

The example actuation cycle of FIG. 5 is illustrated graphically in FIG. 6, wherein line 40 represents deformation of the actuator (relative to an initial, flat, shape), line 42 represents temperature of the SMA layer, and line 44 represents voltage applied across the EAP. Stages (a)-(e) are marked along the graph at the points at which they occur. Between stage (a) and (b) temperature and deformation together increase, as the SMA layer transitions from martensite to austenite phase, and re-forms into its shape-memory shape. Between (b) and (c) temperature decreases back to its (a)-stage level, but deformation only reduces very slightly—this reduction due to the material 'equilibrating' to its low-temperature elasticity. Between (c) and (d), the EAP voltage steadily increases from zero, and actuator deformation deceases (almost proportionately) in response, returning to stage-(a) 'zero' deformation when the voltage is at its highest. Between (d) and (e), the voltage to the EAP is switched off, but the deformation remains unchanged. Since the SMA layer is in its martensite phase, the EAP voltage is zero, and the actuator is returned to its 'flat' shape, stage (e) is physically identical to stage (a), and from this state, the actuation cycle can begin again, continuing from (a)/(e) through to (d).

Although in the particular actuation method depicted by FIG. 5, and described above, the SMA layer is heated through application of a current across the material, in alternative embodiments, the heating might achieved through different means, for example through an external heating element in thermal communication with the SMA layer. The stages of the actuation cycle would in this case be nonetheless be identical. Furthermore, in certain embodiments, the electric field might be established across the EAP layer via a separate, dedicated anode-cathode pair in communication with sais layer, rather than via the SMA layer and anode 28.

Although the particular example actuation method depicted in FIG. 5 shows the SMA high-temperature shape comprising a 'bent' configuration, displaced from a flat configuration, in alternate embodiments, the SMA memory shape might comprise the flat configuration instead. In this case, the EAP layer would deform the actuator into a bent shape, and heating of the SMA would stimulate a transition to the flat shape. This may be preferable in applications where a 'pulling' actuation action is required, for example, rather than a 'pushing' actuation action.

As described above, the transition of the SMA layer from its martensite shape to its austenite shape is capable of delivering significant force, and hence the transition from stage (a) to stage (b) in the example cycle of FIG. 5 may typically be used to provide the main actuation force within any actuation method. However, although the force generated by the EAP layer during its deformation is significantly less that that generated by the SMA during its shape-change, the force is nonetheless sufficient to perform a low-intensity actuation function. Furthermore, as also discussed above, the extent of EAP deformation can be controlled through varying the applied electric field: a greater field will generate a greater extent of deformation. Hence, the transition from stage (c) to stage (d) might also, in some embodiments, be utilised to perform an additional—or even the only—actuation function. In particular, applications in which it would be advantageous to control the speed of actuation, or to control in real-time, for example, the progress of the actuator deformation, may benefit from employing the EAP transition for imparting actuating forces.

Figures 7A, 7B:
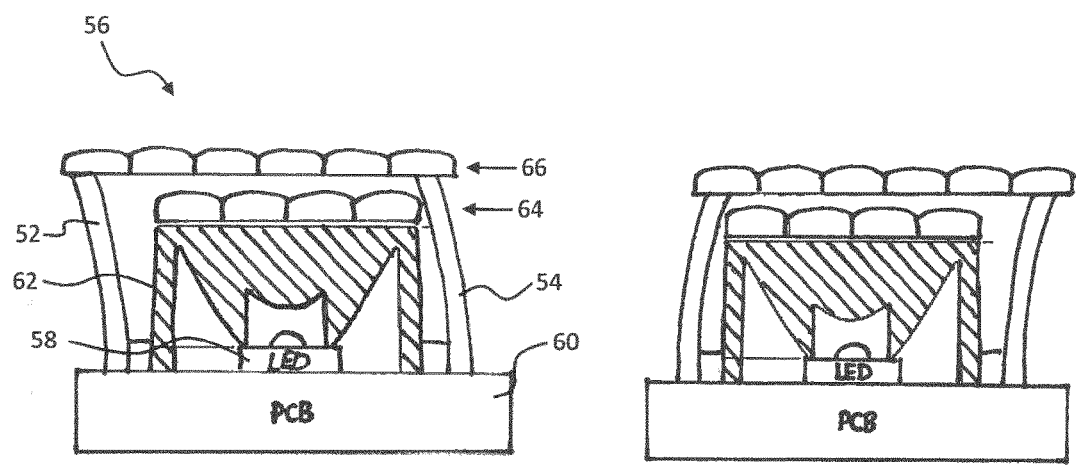
FIGS. 7a-b show an example beam-shaping element incorporating one or more actuator embodiments.

In some applications, the delivery of a significant stroke force on actuation may not be as significant as the peculiar bi-directional functionality which the actuator is able to achieve. One such example application is illustrated in FIGS. 7a and 7b, wherein a pair of actuators 52, 54 in accordance with the invention are used to form part of an LED beam shaping apparatus 56. In this particular example, an LED 58 is mounted on a PCB 60, and is disposed within an optical chamber 62, beneath a first, fixed, lenticular array structure 64. Surrounding the LED and the first array structure are two actuators 52, 54 forming walls of a light-directing channel. At the end of the channel is mounted a second lenticular array 66, spanning between the two actuator 'walls'.

As illustrated by FIGS. 7a and 7b, by activating the actuators in concert, in alternate 'forwards' and 'backwards' deformations, the directional orientation of the channel can be altered, 'sweeping' the output angle from side to side, and thereby altering the propagation direction of the emitted beam. The secondary optics (lenticular arrays 64,66) allow for a focussing or collimating of the emitted light, so as to provide, for example, a highly directional beam output. This may be particularly advantageous within the field of vehicular front lighting, for example, wherein the directional control of the output beam might be used to provide adaptive/dynamically controllable light output. Moreover, the optics can be set in a certain position and kept there for extended periods of time without having to maintain application of voltage to the EAP (since when the SMA is in martensite phase, adjustments to the deformation remain fixed even once the voltage is switched off). Additionally, the actuator is strong enough to avoid low frequency vibrations which could be visible and aesthetically displeasing to observers.

While in the illustrative example of FIGS. 7a-b, the walls of the light-directing channel as depicted as comprising just a pair of actuators, in more sophisticated examples, more actuators might be utilised, for example at the 'front' and 'back' of the channel, as it is shown in FIG. 7. In this way, the channel might be provided directional control across two different planes: side-to-side, and front-to-back. Alternatively, the remaining portions of the channel walls might simply comprise flexible membranes, so as to provide encapsulation of the light, and to allow the channel to flex between its different positions.

Figure 8A:
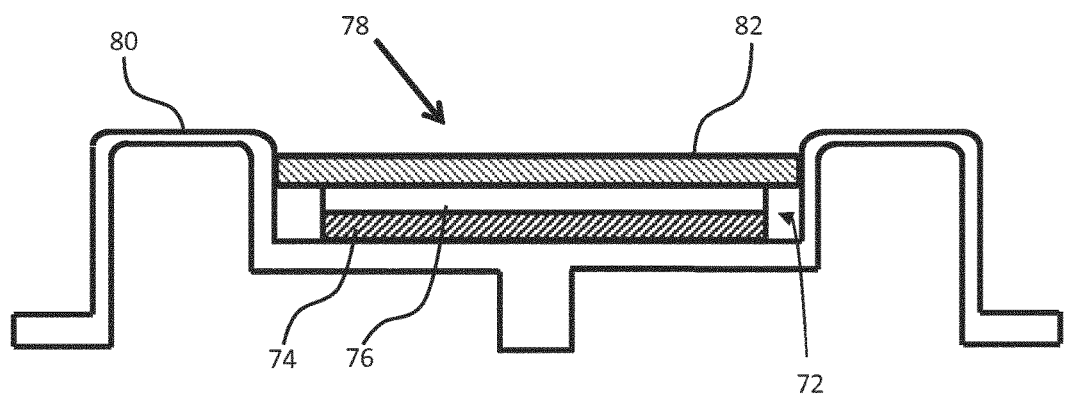
FIGS. 8a-b show a skin-contacting element of a shaver device incorporating an embodiment of an actuator.
Figure 8B:
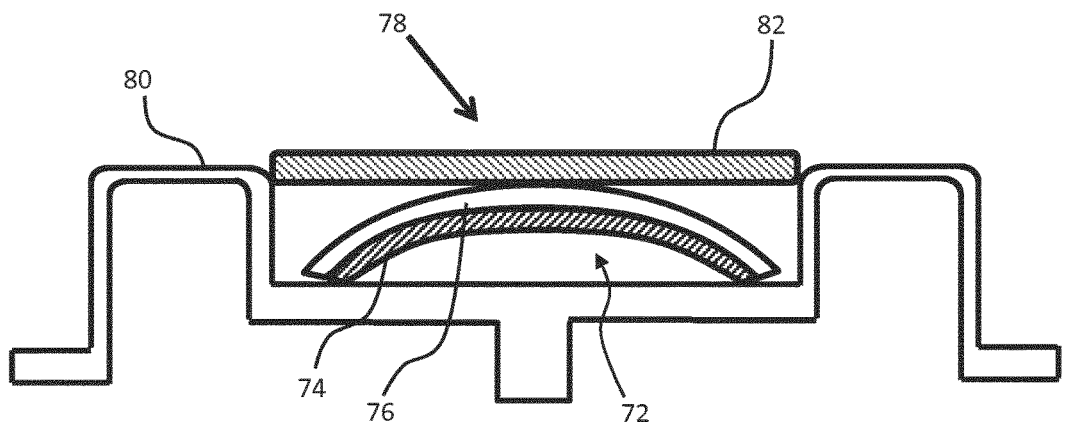

As discussed above, the controllable deformation of the actuator during the EAP layer transition renders the actuator particular useful in applications for which sensitive control of speed or extent of actuation are desirable. One particular example of such an application is illustrated in FIGS. 8a and 8b, wherein the actuator 72, having SMA layer 74 and EAP layer 76, forms part of the skin-contacting element 78 of a shaver device 80, and is used to adjust the relative positioning and/or pressure between the shaver and a user's skin. For example, the actuator might be used in order to provide continuous contact between the shaver contact area 82 and a user's face, therefore increasing efficiency or efficacy of the shaver device. As shown by FIG. 8b, actuation of the actuator 72 may be utilised to raise the 'vertical' positioning of the skin contact area 82 of the shaver, thereby adjusting the position of the contact area relative to a user's skin. Then, through subsequent controlled application of voltage to the EAP layer 76 this vertical position can be carefully reduced in accordance with the positioning or pressure applied to the shaver contact element 78.

According to an aspect of the invention, there is further provided a means of producing a bi-directional actuator, comprising coupling a first layer element, comprising a shape-memory alloy, to a second layer element, comprising an electro-active polymer—such that the two elements follow the same shape—and, additionally, providing a heating means such that the heating means is in thermal communication with the first layer element.

The coupling might comprise, in certain embodiments a lamination process, for example.

Alternatively, in other embodiments, the coupling might be achieved through a coating of the polymer layer onto the alloy layer, for example. According to this method, the alloy layer and the polymer layer of the actuator are in electrical communication, and hence the embodiment of FIG. 4—in which the SMA layer is utilised as electrode for the EAP layer—would be readily realisable. In addition, by using a coating method, the actuator may be thinner, since no laminating layer is required which will have a minimum required thickness and structural rigidity.

As explained above, a field-driven EAP device is preferably used, but the invention is not limited to such EAP devices. However, the electroactive polymers which may be used can be subdivided into field-driven and ionic-driven materials.

Examples of field-driven EAPs include Piezoelectric polymers, Electrostrictive polymers (such as PVDF based relaxor polymers or polyurethanes) and Dielectric Elastomers. Other examples include Electrostrictive Graft polymers, Electrostrictive paper, Electrets, Electroviscoelastic Elastomers and Liquid Crystal Elastomers.

Examples of ionic-driven EAPs are conjugated/conducting polymers, Ionic Polymer Metal Composites (IPMC) and carbon nanotubes (CNTs). Other examples include ionic polymer gels.

Field-driven EAPs are actuated by an electric field through direct electromechanical coupling. They usually require high fields (volts per meter) but low currents. Polymer layers are usually thin to keep the driving voltage as low as possible. Ionic EAPs are activated by an electrically induced transport of ions and/or solvent. They usually require low voltages but high currents. They require a liquid/gel electrolyte medium (although some material systems can also operate using solid electrolytes). Both classes of EAP have multiple family members, each having their own advantages and disadvantages.

A first notable subclass of Field driven EAPs are Piezoelectric and Electrostrictive polymers. While the electromechanical performance of traditional piezoelectric polymers is limited, a breakthrough in improving this performance has led to PVDF relaxor polymers, which show spontaneous electric polarization (field driven alignment). These materials can be pre-strained for improved performance in the strained direction (pre-strain leads to better molecular alignment). Normally, metal electrodes are used since strains usually are in the moderate regime (1-5%). Other types of electrodes (such as conducting polymers, carbon black based oils, gels or elastomers, etc.) can also be used. The electrodes can be continuous, or segmented.

Another subclass of interest of filed driven EAPs is that of Dielectric elastomers. A thin film of this material may be sandwiched between compliant electrodes, forming a parallel plate capacitor. In the case of dielectric elastomers, the Maxwell stress induced by the applied electric field results in a stress on the film, causing it to contract in thickness and expand in area. Strain performance is typically enlarged by pre-straining the elastomer (requiring a frame to hold the pre-strain). Strains can be considerable (10-300%). This also constrains the type of electrodes that can be used: for low and moderate strains, metal electrodes and conducting polymer electrodes can be considered, for the high-strain regime, carbon black based oils, gels or elastomers are typically used. The electrodes can be continuous, or segmented.

A first notable subclass of ionic EAPs is Ionic Polymer Metal Composites (IPMCs). IPMCs consist of a solvent swollen ion-exchange polymer membrane laminated between two thin metal or carbon based electrodes and requires the use of an electrolyte. Typical electrode materials are Pt, Gd, CNTs, CPs, Pd. Typical electrolytes are Li+ and Na+ water-based solutions. When a field is applied, cations typically travel to the cathode side together with water. This leads to reorganization of hydrophilic clusters and to polymer expansion. Strain in the cathode area leads to stress in rest of the polymer matrix resulting in bending towards the anode. Reversing the applied voltage inverts bending. Well known polymer membranes are Nafion® and Flemion®.

Another notable subclass of Ionic polymers is Conjugated/conducting polymers. A conjugated polymer actuator typically consists of an electrolyte sandwiched by two layers of the conjugated polymer. The electrolyte is used to change oxidation state. When a potential is applied to the polymer through the electrolyte, electrons are added to or removed from the polymer, driving oxidation and reduction. Reduction results in contraction, oxidation in expansion.

In some cases, thin film electrodes are added when the polymer itself lacks sufficient conductivity (dimension-wise). The electrolyte can be a liquid, a gel or a solid material (i.e. complex of high molecular weight polymers and metal salts). Most common conjugated polymers are polypyrolle (PPy), Polyaniline (PANi) and polythiophene (PTh).

An actuator may also be formed of carbon nanotubes (CNTs), suspended in an electrolyte. The electrolyte forms a double layer with the nanotubes, allowing injection of charges. This double-layer charge injection is considered as the primary mechanism in CNT actuators. The CNT acts as an electrode capacitor with charge injected into the CNT, which is then balanced by an electrical double-layer formed by movement of electrolytes to the CNT surface. Changing the charge on the carbon atoms results in changes of C—C bond length. As a result, expansion and contraction of single CNT can be observed.

Materials suitable for the EAP layer are known. Electroactive polymers include, but are not limited to, the sub-classes: piezoelectric polymers, electromechanical polymers, relaxor ferroelectric polymers, electrostrictive polymers, dielectric elastomers, liquid crystal elastomers, conjugated polymers, Ionic Polymer Metal Composites, ionic gels and polymer gels.

The sub-class electrostrictive polymers includes, but is not limited to:

Polyvinylidene fluoride (PVDF), Polyvinylidene fluoride-trifluoroethylene (PVDF-TrFE), Polyvinylidene fluoride-trifluoroethylene-chlorofluoroethylene (PVDF-TrFE-CFE), Polyvinylidene fluoride-trifluoroethylene-chlorotrifluoroethylene) (PVDF-TrFE-CTFE), Polyvinylidene fluoride-hexafluoropropylene (PVDF-HFP), polyurethanes or blends thereof.

The sub-class dielectric elastomers includes, but is not limited to:

acrylates, polyurethanes, silicones.

The sub-class conjugated polymers includes, but is not limited to:

polypyrrole, poly-3,4-ethylenedioxythiophene, poly(p-phenylene sulfide), polyanilines.

Ionic devices may be based on ionic polymer-metal composites (IPMCs) or conjugated polymers. An ionic polymer-metal composite (IPMC) is a synthetic composite nanomaterial that displays artificial muscle behavior under an applied voltage or electric field.

In more detail, IPMCs are composed of an ionic polymer like Nafion or Flemion whose surfaces are chemically plated or physically coated with conductors such as platinum or gold, or carbon-based electrodes. Under an applied voltage, ion migration and redistribution due to the imposed voltage across a strip of IPMCs result in a bending deformation. The polymer is a solvent swollen ion-exchange polymer membrane. The field causes cations travel to cathode side together with water. This leads to reorganization of hydrophilic clusters and to polymer expansion. Strain in the cathode area leads to stress in rest of the polymer matrix resulting in bending towards the anode. Reversing the applied voltage inverts the bending.

If the plated electrodes are arranged in a non-symmetric configuration, the imposed voltage can induce all kinds of deformations such as twisting, rolling, torsioning, turning, and non-symmetric bending deformation.

In all of these examples, additional passive layers may be provided for influencing the electrical and/or mechanical behavior of the EAP layer in response to an applied electric field.

The EAP layer of each unit may be sandwiched between electrodes. The electrodes may be stretchable so that they follow the deformation of the EAP material layer. Materials suitable for the electrodes are also known, and may for example be selected from the group consisting of thin metal films, such as gold, copper, or aluminum or organic conductors such as carbon black, carbon nanotubes, graphene, poly-aniline (PANI), poly(3,4-ethylenedioxythiophene) (PEDOT), e.g. poly(3,4-ethylenedioxythiophene) poly(styrenesulfonate) (PEDOT:PSS). Metalized polyester films may also be used, such as metalized polyethylene terephthalate (PET), for example using an aluminum coating.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage. Any reference signs in the claims should not be construed as limiting the scope.

The invention claimed is:

1. A bi-directional actuator, comprising:
a heat-sensitive shape-memory layer, wherein the heat-sensitive shape-memory layer comprises a shape memory alloy, the shape memory alloy existing in a first phase below a first temperature, and in a second phase above a second temperature, and wherein a transition from the first to the second phase stimulates the heat-sensitive shape-memory layer to move from any first shape into a second, predetermined shape;
an electro-active polymer layer, coupled with the heat-sensitive shape-memory layer such that both follow a same shape, the electro-active polymer layer being deformable, in response to an applied voltage; and
a heating means for controlling a temperature of the heat-sensitive shape-memory layer, wherein the heat-sensitive shape-memory layer and electro-active polymer layer provide bi-directional functionality in which the shape-memory alloy deforms with a first force on transition between the first phase to the second phase, wherein the first force provides an actuation force in a first direction, and in which the electro-active polymer layer provides a manual deformation of the shape-memory alloy back away from the second, pre-determined shape of the second phase, in a second direction, opposite the first direction, in response to an application of the applied voltage for a controlled speed and extent of the manual deformation in the second direction.

2. The actuator as claimed in claim 1, wherein the heating means comprises at least two contact terminals in electrical communication with the shape memory alloy, for delivery of an electrical current through the shape memory alloy.

3. The actuator as claimed in claim 1, wherein the heating means comprises a heating element in thermal communication with the heat-sensitive shape-memory layer.

4. The actuator as claimed in claim 1, wherein the heat-sensitive shape-memory layer comprises a layer of polymer material having an embedded shape memory alloy wire.

5. A beam-shaping element, comprising:
a light-directing channel having one or more boundary walls, wherein at least one boundary wall comprises one or more of the actuators as claimed in claim 1; and
a light source for emitting a beam within the light-directing channel.

6. A beam shaping element, comprising;
a channel having one or more boundary walls, wherein at least one boundary wall comprises one or more actuator that comprises (i) a heat-sensitive shape-memory layer, wherein the heat-sensitive shape-memory layer includes a shape memory alloy, the shape memory alloy existing in a first phase below a first temperature, and a second phase above a second temperature, and wherein a transition from the first to the second phase stimulates the heat-sensitive shape-memory layer to move from any first shape into a second, predetermined shape, (ii) an electro-active polymer layer, coupled with the heat-sensitive shape-memory layer such that both follow a same shape, the electro-active polymer layer being deformable, in response to an applied voltage, and a heating means for controlling a temperature of the heat-sensitive shape-memory layer; and
one or more optical elements arranged at one end of the channel.

7. An adaptive lighting device comprising:
one or more beam-shaping elements that comprise a channel having one or more boundary walls, wherein at least one boundary wall comprises one or more actuator that comprise (i) a heat-sensitive shape-memory layer, wherein the heat-sensitive shape-memory layer includes a shape memory alloy, the shape memory alloy existing in a first phase below a first temperature, and a second phase above a second temperature, and wherein a transition from the first to the second phase stimulates the heat-sensitive shape-memory layer to move from any first shape into a second, predetermined shape, (ii) an electro-active polymer layer, coupled with the heat-sensitive shape-memory layer such that both follow a same shape, the electro-active polymer layer being deformable, in response to an applied voltage, and a heating means for controlling a temperature of the heat-sensitive shape-memory layer; and
one or more solid-state lighting elements disposed within at least one boundary wall of the channel.

8. A skin-contacting structure for a skin-hair shaving device, the skin contacting structure for contacting a skin portion of a skin during shaving of said skin by the shaving device, the structure comprising an actuator for altering a relative position or orientation between at least a part of the skin contacting structure and the skin portion, wherein the actuator comprises (i) a heat-sensitive shape-memory layer, wherein the heat-sensitive shape-memory layer includes a shape memory alloy, the shape memory alloy existing in a first phase below a first temperature, and a second phase above a second temperature, and wherein a transition from the first to the second phase stimulates the heat-sensitive shape-memory layer to move from any first shape into a second, predetermined shape, (ii) an electro-active polymer layer, coupled with the heat-sensitive shape-memory layer such that both follow a same shape, the electro-active polymer layer being deformable, in response to an applied voltage, and a heating means for controlling a temperature of the heat-sensitive shape-memory layer.

9. A bi-directional actuation method, comprising:
increasing, via a heating means, a temperature of a first layer element comprising that comprises a shape-memory alloy, above a transition temperature for stimulating the shape-memory alloy to transition from a first shape at a first temperature into a second, predetermined shape at a second temperature;
decreasing the temperature of the first layer element to a third temperature; and
applying a voltage to a second layer element, wherein the second layer element is coupled with the first layer element such that the first and second layer elements together follow a same shape, and wherein the second layer element comprises an electro-active polymer, for stimulating the electro-active polymer to deform from the second, pre-determined shape, into a third shape, the third shape dependent upon a magnitude of the voltage being applied,
wherein the shape-memory alloy of the first layer element and electro-active polymer of the second layer element provide bi-directional functionality in which the shape-memory alloy deforms with a first force in a first direction on transition between a first phase to a second phase, and in which the electro-active polymer provides a manual deformation of the shape-memory alloy back away from the second, pre-determined shape of the second phase, in a second direction, opposite the first direction, in response to an application of the voltage for a controlled speed and extent of the manual deformation in the second direction.

10. The method as claimed in claim 9, wherein the voltage is applied to the second layer element having a magnitude such that the third shape is identical to the first shape.

11. The method as claimed in claim 9, wherein the transition of the first layer element from the first shape to the second, predetermined shape, is used to deliver the first force, wherein the first force comprises an actuation force.

12. The method as claimed in claim 9, wherein the manual deformation provided by the electro-active polymer of the second layer element is used to deliver a second force that comprises an actuation force.

13. The method as claimed in claim 9, wherein the heating means comprises a joule heating process, and wherein a current is passed through at least a portion of the first layer element.

14. The method as claimed in claim 9, wherein the voltage is applied to the second layer element via the first layer element, wherein the first layer element is in electrical communication with the second layer element.

15. A method of producing a bi-directional actuator, comprising:

coupling a first layer element that comprises a shape-memory alloy to a second layer element that comprises an electro-active polymer, such that the first and second layer elements together follow a same shape; and providing a heating means in thermal communication with the first layer element, wherein the shape-memory alloy exists in a first phase below a first temperature, and in a second phase above a second temperature, and wherein a transition from the first to the second phase stimulates the shape-memory alloy to move from any first shape into a second, predetermined shape, wherein the electro-active polymer is deformable in response to an applied voltage, and wherein the heating means controls the temperature of the shape-memory alloy, wherein the first layer element and the second layer element provide bi-directional functionality in which the shape-memory alloy deforms with a first force in a first direction on transition between the first phase to the second phase, and in which the electro-active polymer provides a manual deformation of the shape-memory alloy back away from the second, pre-determined shape of the second phase, in a second direction, opposite the first direction, in response to an application of the applied voltage for a controlled speed and extent of the manual deformation in the second direction.

* * * * *